United States Patent
Reynov et al.

(10) Patent No.: US 8,630,087 B1
(45) Date of Patent: Jan. 14, 2014

(54) AIRFLOW SYSTEM, CABLE ACCESS SYSTEM, AND CABLE MANAGEMENT SYSTEM BASED ON MIDPLANE HAVING HOLES, SIDE ACCESS OF CHASSIS, AND CARD CONFIGURATION

(75) Inventors: Boris Reynov, Cupertino, CA (US); Bruce Thompson, Los Altos, CA (US); Ben Nitzan, El Granada, CA (US); Shreeram Siddhaye, Sunnyvale, CA (US); Jack Kohn, Mountain View, CA (US); Euan Mowat, San Francisco, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 382 days.

(21) Appl. No.: 12/603,931

(22) Filed: Oct. 22, 2009

(51) Int. Cl.
*G06F 1/16* (2006.01)
*H05K 5/00* (2006.01)
*H05K 7/00* (2006.01)

(52) U.S. Cl.
USPC .................................................. 361/679.5

(58) Field of Classification Search
USPC .................. 361/679.46–679.54, 688–695
See application file for complete search history.

(56) References Cited

U.S. PATENT DOCUMENTS

| | | | |
|---|---|---|---|
| 5,751,549 A * | 5/1998 | Eberhardt et al. | 361/679.33 |
| 6,330,161 B1 * | 12/2001 | Smith et al. | 361/724 |
| 6,335,867 B1 * | 1/2002 | Ishibashi et al. | 361/788 |
| 6,538,899 B1 * | 3/2003 | Krishnamurthi et al. | 361/788 |
| 6,972,949 B1 * | 12/2005 | Helgenberg et al. | 361/679.02 |
| 7,639,486 B2 * | 12/2009 | Champion et al. | 361/679.32 |
| 8,139,358 B2 * | 3/2012 | Tambe | 361/695 |
| 2004/0201957 A1 * | 10/2004 | Wu et al. | 361/687 |
| 2005/0207134 A1 * | 9/2005 | Belady et al. | 361/796 |
| 2005/0281014 A1 * | 12/2005 | Carullo et al. | 361/796 |
| 2007/0081315 A1 * | 4/2007 | Mondor et al. | 361/788 |
| 2007/0086172 A1 * | 4/2007 | Lai et al. | 361/727 |
| 2007/0121306 A1 * | 5/2007 | Moakes et al. | 361/788 |
| 2008/0298014 A1 * | 12/2008 | Franco | 361/688 |
| 2009/0086441 A1 * | 4/2009 | Randall et al. | 361/724 |
| 2009/0097200 A1 * | 4/2009 | Sharma et al. | 361/688 |
| 2009/0190301 A1 * | 7/2009 | Huang et al. | 361/679.46 |
| 2009/0257187 A1 * | 10/2009 | Mills et al. | 361/679.33 |
| 2010/0008025 A1 * | 1/2010 | Nemoz et al. | 361/678 |
| 2010/0049893 A1 * | 2/2010 | Drako | 710/301 |
| 2010/0097760 A1 * | 4/2010 | Azar et al. | 361/695 |
| 2010/0217909 A1 * | 8/2010 | Pavol et al. | 710/301 |

\* cited by examiner

*Primary Examiner* — Adrian S Wilson (74) *Attorney, Agent, or Firm* — Harrity & Harrity, LLP (57) ABSTRACT

A method for cooling a system having a midplane design in which the midplane includes holes to allow air to flow via the midplane. Cards connected to the midplane have a front face that includes holes to allow the air to flow. The air flows from front to back or back to front to cool the cards connected to the midplane. A multi-slot chassis includes rails to support the cards. The rails form spaces to permit access to sockets associated with the cards to which cables may be connected. Platforms associated with the cards may permit a user to manage cables connected to the cards.

20 Claims, 10 Drawing Sheets

AIRFLOW SYSTEM, CABLE ACCESS SYSTEM, AND CABLE MANAGEMENT SYSTEM BASED ON MIDPLANE HAVING HOLES, SIDE ACCESS OF CHASSIS, AND CARD CONFIGURATION

BACKGROUND

There are various designs for cooling cards (e.g., printed circuit boards (PCBs)) and other components within a chassis of a device. A design of a cooling system may depend on a configuration of the cards and the other components within the device. For example, a device may have a midplane design that includes differently oriented cards. Typically, multiple fan systems may be utilized to cool the differently oriented cards.

Additionally, there are various designs for providing access to connectors and/or cards. For example, a user may wish to access connectors and/or cards for service reasons (e.g., repair, replacement, etc.). Typically, a device having a midplane design may provide that the user disconnect cables from a front of the device. Further, the user may have to disconnect cables from the card before removing the card from the device.

SUMMARY

In an exemplary implementation, a method for cooling a system having a midplane design may include producing, by a cooling system, an airflow having a first direction; directing the airflow, having the first direction, to cool a first set of cards associated with the system; directing the airflow, having the first direction, via the midplane that includes holes to allow the airflow to propagate; directing the airflow, having the first direction, to cool a second set of cards associated with the system; and directing the airflow, having the first direction, to exit the system via the second set of cards.

In another exemplary implementation, a system may include a chassis comprising: rails to support cards, where the rails are spaced apart to form spaces between the rails, where the spaces provide access to sockets associated with the cards, the sockets to receive cables; where a front face of the chassis is to receive front faces of the cards; and where the spaces are associated with one or more side faces of the chassis, the one or more side faces not being the front face of the chassis nor a back face of the chassis.

In yet another exemplary implementation, a card may include a platform to be received by a chassis; electronic components, where the electronic components are supported by the platform; a front face having holes to allow air to flow via the holes and cool the electronic components; and one or more side faces comprising sockets to receive cables, the one or more side faces not being the front face of the card nor a back face of the card.

In still another exemplary implementation, a card may include a platform to be received by a chassis; electronic components, where the electronic components are supported by the platform; a front face having holes to allow air to flow via the holes and cool the electronic components; and one or more side faces comprising sockets to receive cables, the one or more side faces not being the front face of the card nor a back face of the card, and where the platform extends from the one or more side faces to allow a cable management system to be supported by the platform.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements. Also, the following description does not limit the invention.

The term "cards," as used herein is intended to be broadly interpreted to include, for example, a device and/or an electronic component of the device. For example, cards may comprise modules, boards (e.g., PCBs), network interfaces, routers, switches, firewalls, bridges, and/or other type of devices (e.g., computational devices) and/or components thereof that process, receive, transmit, and/or transfer data.

Implementations described herein may include methods, devices, and/or systems that provide an airflow system, a cable access system, and a cable management system. In an exemplary implementation of the airflow system, a system may have a midplane design. In such a configuration, the midplane may have perforations (i.e., holes) that allow air to flow via the midplane. For example, vertically and/or horizontally-oriented cards connected to the midplane may be cooled by a cooling system in which air may flow via the midplane.

In an exemplary implementation of the cable access system, a chassis may provide spaces between card support rails to allow a user access to cables that connect to cards. Additionally, the cards may include sockets accessible via the spaces to allow the user to insert the cables into the sockets and remove the cables from the sockets. The cards may include platforms that may be received by the card support rails to support the cards.

In an exemplary implementation of the cable management system, a chassis may provide spaces between card support rails to allow a user access to cables that connect to the cards. Additionally, the cards may include sockets accessible via the spaces to allow the user to insert the cables into the sockets and remove the cables from the sockets. The cards may include platforms that may be received by the card support rails to support the cards. The platforms may also provide support to the cables that connect to the cards via the sockets.

In such a configuration, the user may remove a card from the chassis while keeping the cables connected to the card via the sockets.

Exemplary Airflow System

Figure 1A:
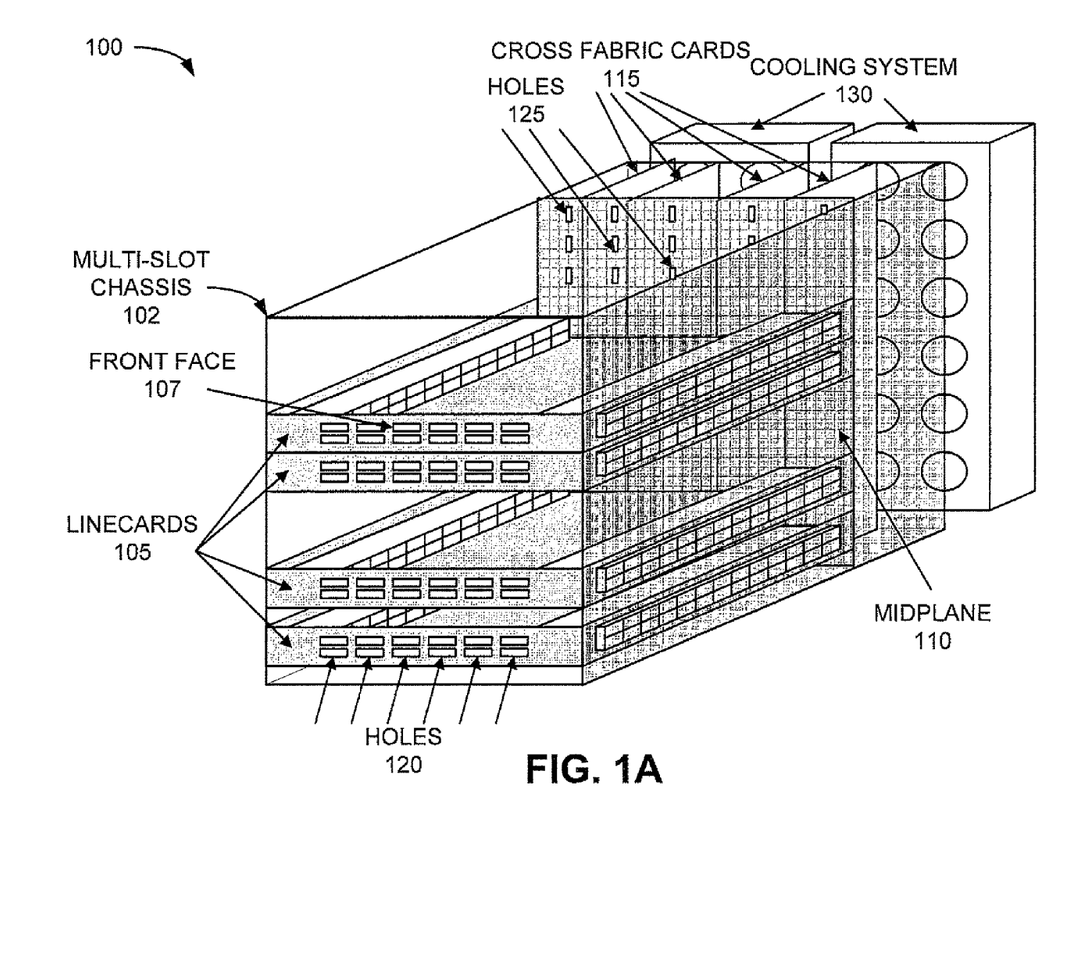
FIG. 1A is a diagram illustrating a frontal view of an exemplary system in which an exemplary airflow system may be implemented.

FIG. 1A is a diagram illustrating a frontal view of an exemplary system 100 according to an exemplary implementation of an airflow system described herein. As illustrated, system 100 may include a multi-slot chassis 102, linecards 105 (singularly referred to as linecard 105), a midplane 110, cross fabric cards 115 (singularly referred to as cross fabric card 115), holes 120, holes 125, and cooling system 130. In other implementations, system 100 may include fewer components, different components, additional components, and/or a different arrangement of components than depicted in FIG. 1A. For example, linecards 105 and/or cross fabric cards 115 may be replaced with a different type of card. Additionally, or alternatively, in other implementations, one or more orientations associated with one or more components of system 100 may be different.

Multi-slot chassis 102 may include a structure to support one or more cards. In an exemplary implementation, multi-slot chassis 102 may include rails or guides (not illustrated) for receiving and supporting cards.

In an exemplary implementation, multi-slot chassis 102 may have a rectilinear configuration. In other implementations, multi-slot chassis 102 may have a different configuration (e.g., square, etc.). Multi-slot chassis 102 may be made of metal, plastic, or a composite material. The size, shape, and/or dimension of multi-slot chassis 102 may vary depending on the number, the size, and/or the shape of the cards supported by multi-slot chassis 102. Although not illustrated, a housing may be secured to multi-slot chassis 102. The housing may be made of panels to protect or cover the cards supported by multi-slot chassis 102.

Linecards 105 may include electronic modules that may terminate lines. For example, the lines may support various services (e.g., telephone, video, etc.). As further illustrated in FIG. 1A, linecards 105 may include holes 120. In an exemplary implementation, holes 120 may be placed in a front face 107 of linecard 105. Front face 107 may be a planar structure (e.g., a plate). This is in contrast to conventional systems in which the front faces of linecards 105 may be used to connect cables (not illustrated) to linecards 105. The size, the number, the shape, the arrangement, and/or the density of holes 120 may be calibrated based on airflow opening requirements, heat factors, etc. As will be described herein, holes 120 may permit air to flow inward toward or outward from system 100 depending on whether cooling system 130 are pushing or pulling air. In this example, linecards 105 may be horizontally oriented. Linecards 105 may connect to midplane 110.

Midplane 110 may include an electronic module for mating (i.e., connecting) linecards 105 with cross fabric cards 115. Midplane 110 may connect to a power supply (not illustrated). Midplane 110 may include holes 125. Holes 125 may allow air to flow between linecards 105 and cross fabric cards 115. The size, the number, the shape, the arrangement, and/or the density of holes 125 may be calibrated based on airflow opening requirements, heat factors, etc. In this example, midplane 110 may be oriented orthogonal to both linecards 105 and cross fabric cards 115.

Cross fabric cards 115 may include electronic modules that may provide routing functionalities. In this example, cross fabric cards 115 may be vertically oriented. Cross fabric cards 115 may connect to midplane 110.

Cooling system 130 may include a system to cool system 100. For example, cooling system 130 may include fans, blowers, impellers, and/or some other type of device or system that may cool system 100. Cooling system 130 may push or pull air. In this example, cooling system 130 may be oriented on a plane parallel to midplane 110. In an exemplary implementation, as illustrated in FIG. 1A, cooling system 130 may be proximate to cross fabric cards 115. In another exemplary implementation, cooling system 130 may be proximate to front faces 107.

Figure 1B:
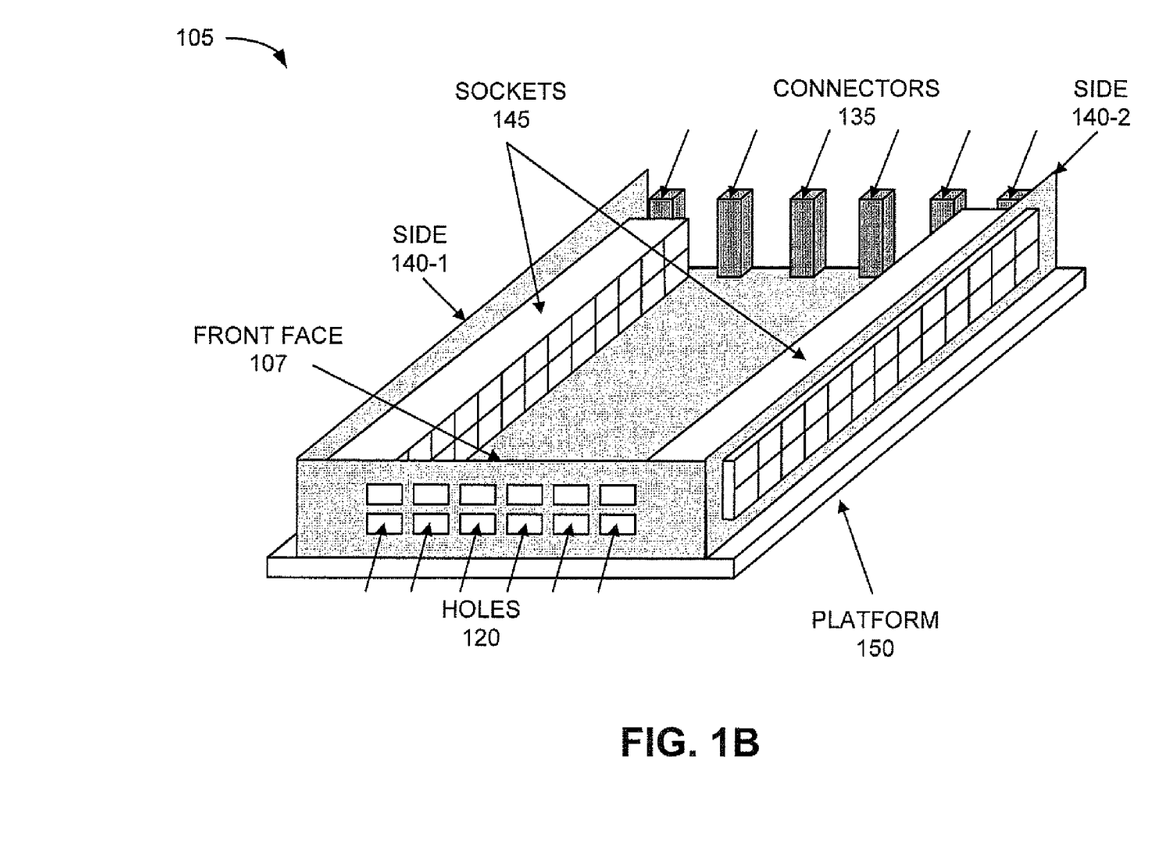
FIG. 1B is a diagram illustrating a frontal, elevated view of an exemplary linecard illustrated in FIG. 1A.

FIG. 1B is a diagram illustrating a frontal, elevated view of exemplary linecard 105. As illustrated, linecard 105 may include connectors 135, sides 140-1 and 140-2 (collectively referred to as sides 140 and singularly as side 140), sockets 145, and a platform 150.

Figure 1C:
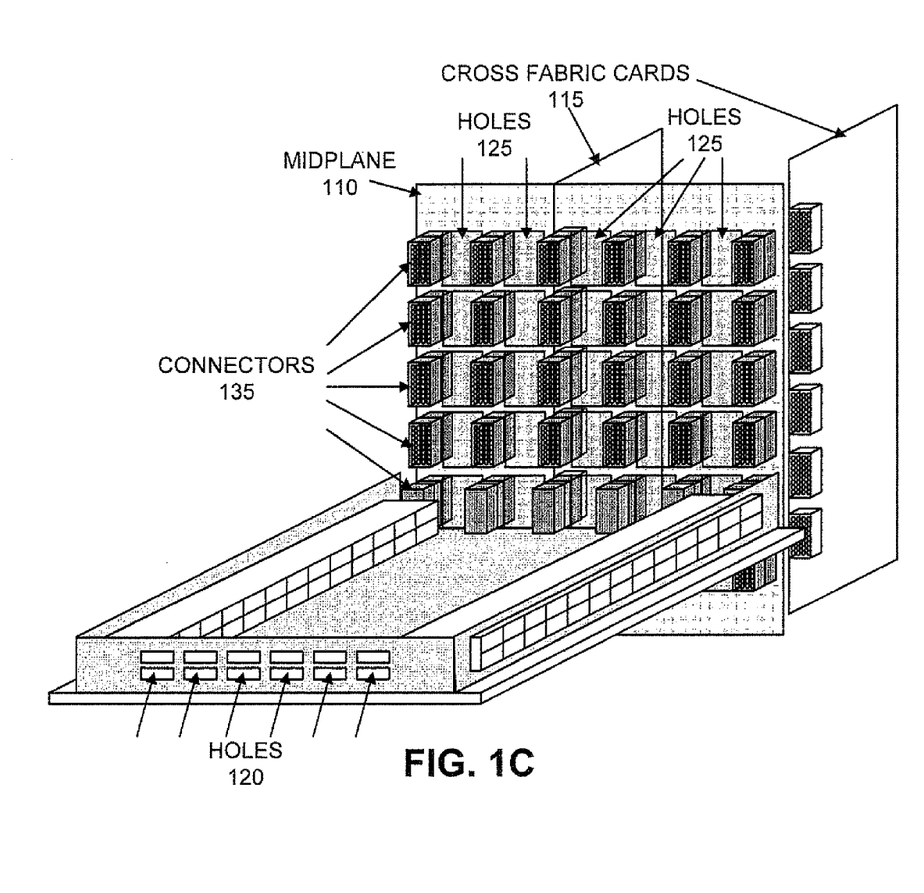
FIG. 1C is a diagram illustrating the exemplary linecard connected to an exemplary midplane.

Connectors 135 may allow linecard 105 to connect to midplane 110. For example, as illustrated in FIG. 1C, connectors 135 may connect to midplane 110, and holes 125 may be positioned in portions of midplane 110 in which connectors 135 do not exist. While in this example, connectors 135 and holes 125 are illustrated in an array fashion, other arrangements may be implemented. Cooling system 130 may cause air to propagate via holes 125 of midplane 110.

Referring back to FIG. 1B, sides 140 may include sockets 145. Sockets 145 may permit a user to insert plugs into or remove plugs from linecard 105 (plugs not illustrated). For example, sockets 145 may be configured to receive various types of plugs, such as, for example, a Universal Serial Bus (USB) plug, an eight position, eight conductors (8P8C or "RJ45") plug, a nine-pin D-shell (DE-9) plug, an optical plug (e.g., a standard connector (SC), a ferrule connector (FC), a sub miniature A (SMA) plug, etc.), a telephone plug; etc., which may be associated with cables (not illustrated). The number of sockets 145 and/or the arrangement of sockets 145 may be depend on various factors, such as, for example, the type of plugs, the type of card, etc.

Platform 150 may include a planar structure that provides support for linecard 105. Front face 107 and sides 140 may connect to a surface of platform 150. As will be described in greater detail below, platform 150 may be configured so as to support linecard 105 within multi-slot chassis 102.

As previously described, in an exemplary implementation, front face 107 may include holes 120. This is in contrast to conventional systems in which the front faces of linecards 105 may be used to connect cables (not illustrated) to linecards 105. Additionally, in contrast to conventional systems in which sides 140 may include cooling system 130 and/or unperforated sides, sides 140 may include sockets 145 to permit connections to linecard 105. As will be described further below, depending on a dimension of linecard 105, sockets 145 may provide for a greater number of connections to linecard 105 compared to conventional systems.

Although FIG. 1B illustrates components of an exemplary linecard 105, in other implementations, linecard 105 may include fewer components, different components, additional components, and/or a different arrangement of components than depicted in FIG. 1B. For example, only one of sides 140 may include sockets 145 in another exemplary implementation. Additionally, or alternatively, in other implementations, the number of sockets 145 and/or the dimension of sockets 145 compared to sides 140 may be different.

Figure 1D:
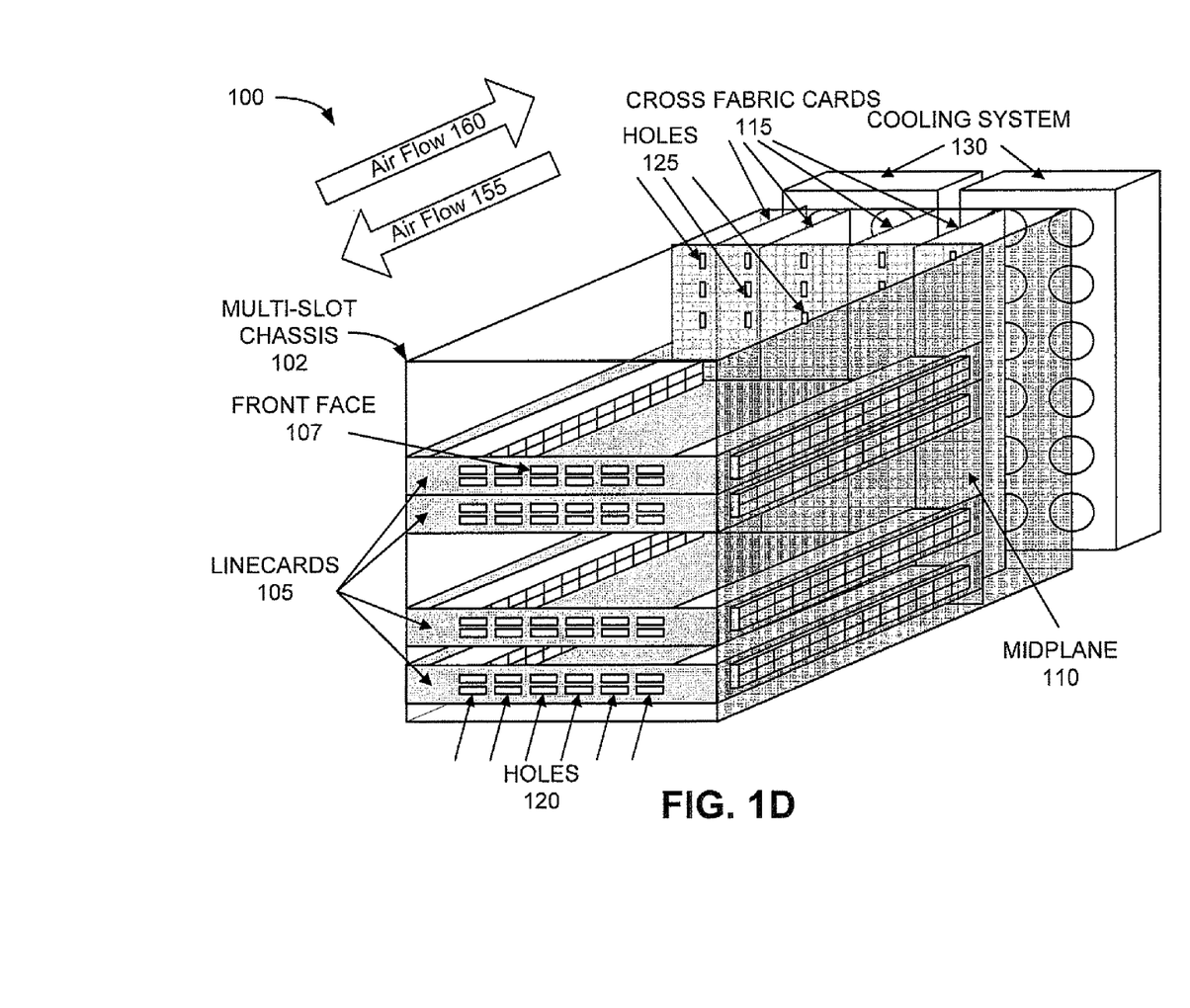
FIG. 1D is a diagram illustrating an exemplary implementation of the airflow system.

FIG. 1D is a diagram illustrating an exemplary implementation of the airflow system. As illustrated, depending on whether cooling system 130 may push or may pull air, an airflow 155 or an airflow 160 may propagate through system 100. For example, when cooling system 130 may push air, airflow 155 may propagate to cool cross fabric cards 115, propagate through holes 125 of midplane 110, propagate to cool linecards 105, and exit system 100 via holes 120. Conversely, when cooling system 130 may pull air, airflow 160 may propagate in an opposite manner.

Figure 2:
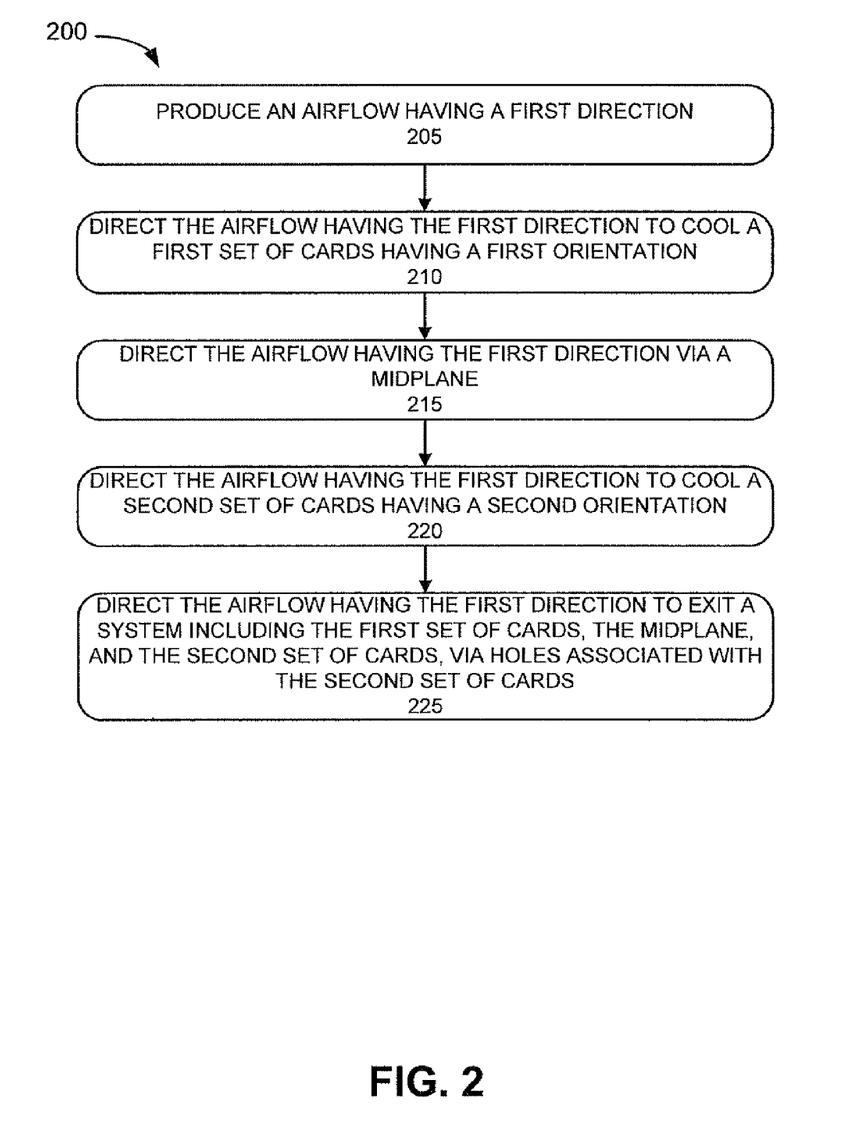
FIG. 2 is a flow diagram illustrating an exemplary process associated with an exemplary implementation of the airflow system described herein.

FIG. 2 is a flow diagram illustrating an exemplary process 200 associated with an exemplary implementation of the airflow system described herein. For ease of description, process 200 will be described in reference to the previous figures, particularly, FIG. 1D. Further, process 200 will be described in terms of cooling system 130 pushing airflow 155. It will be appreciated, however, that cooling system 130 may pull airflow 160, in which case, reference to a first set of cards and a second set of cards, may be different.

Process 200 may include producing an airflow having a first direction (block 205). For example, cooling system 130 may produce airflow 155 having a first direction, as illustrated in FIG. 1D. In an exemplary implementation, cooling system 130 may produce airflow 155 having the first direction by pushing air into system 100.

The airflow having the first direction may be directed to cool a first set of cards having a first orientation (block 210). For example, when airflow 155 may be pushed from cooling system 130, airflow 155 may cool cross fabric cards 115. In an exemplary implementation, cross-fabric cards 115 may be positioned to have a first orientation (e.g., vertical). In another implementation, the orientation of cross-fabric cards 115 may be different.

The airflow having the first direction may be directed via a midplane (block 215). For example, airflow 155 having the first direction may propagate via holes 125 of midplane 110.

The airflow having the first direction may be directed to cool a second set of cards having a second orientation (block 220). For example, airflow 155 having the first direction may propagate to cool linecards 105. In an exemplary implementation, linecards 105 may be positioned to have a second orientation (e.g., horizontal) that is different from cross fabric cards 115. In another implementation, the orientation of linecards 105 may be different.

The airflow having the first direction may exit a system including the first set of cards, the midplane, and the second set of cards via holes associated with the second set of cards (block 225). For example, airflow 155 may exit system 100 via holes 120 of linecards 105.

Although FIG. 2 illustrates an exemplary process 200, in other implementations, process 200 may include fewer, additional, and/or different operations.

Exemplary Cable Access System

Figure 3A:
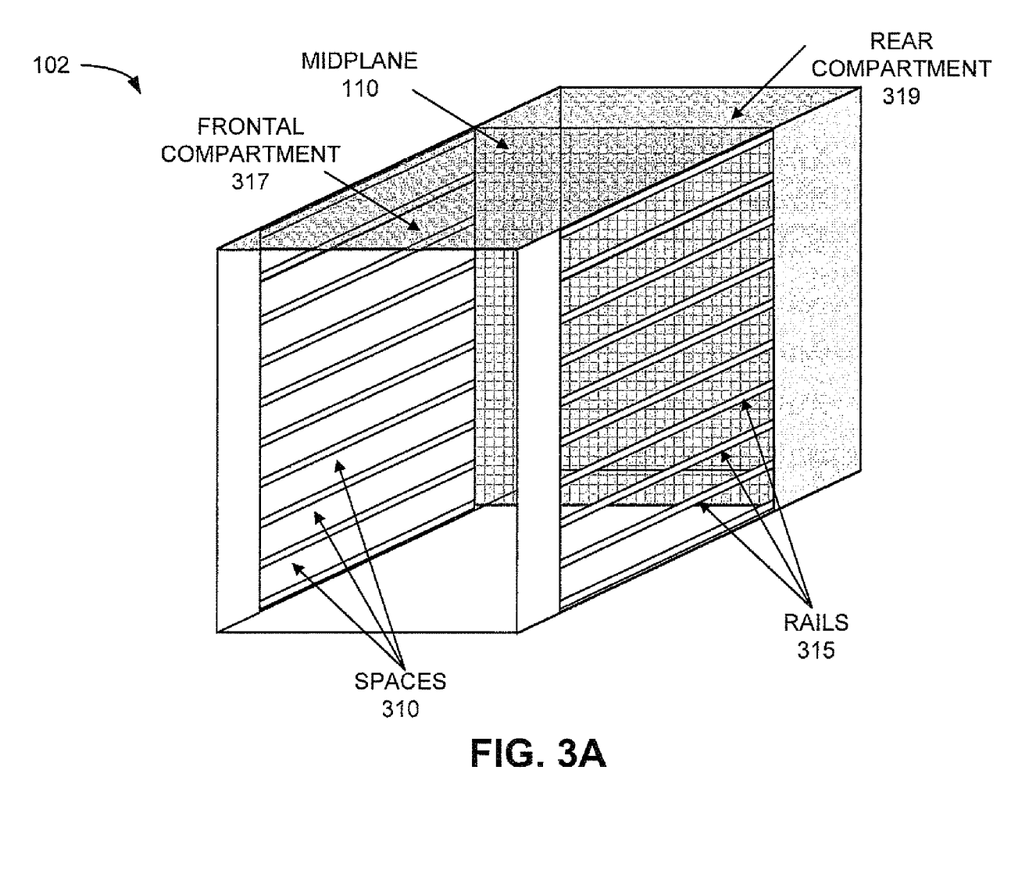
FIG. 3A is a diagram illustrating an exemplary multi-slot chassis.

FIG. 3A is a diagram illustrating an exemplary multi-slot chassis 102. As illustrated, multi-slot chassis 102 may provide spaces 310 and include rails 315. Rails 315 may support linecards 105 when linecards 105 are inserted into multi-slot chassis 102.

In an exemplary implementation, midplane 110 may be an integral component of multi-slot chassis 102. For example, multi-slot chassis 102 may form a frontal compartment 317 and a rear compartment 319 to support cards based on a division of space created by midplane 110 within multi-slot chassis 102.

Figure 3B:
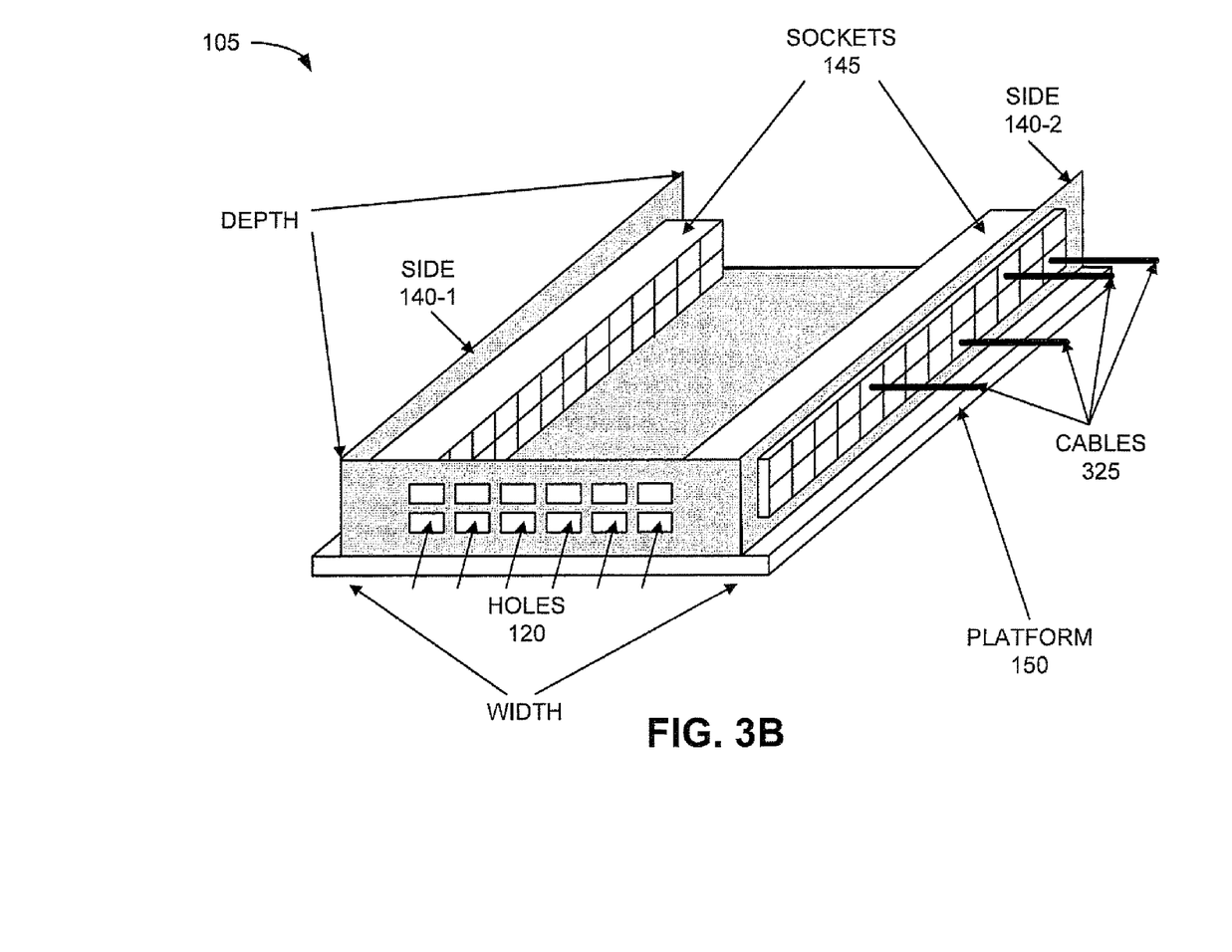
FIG. 3B is a diagram illustrating exemplary linecard connected to cables.

FIG. 3B is a diagram illustrating exemplary linecard 105 connected to cables 325. As illustrated, cables 325 may be connected to linecard 105 via sockets 145. In an exemplary implementation, sockets 145 may be included in both sides 140 of linecard 105. In another exemplary implementation, sockets 145 may be included in one side 140 of linecard 105. Depending on the dimension (e.g., width and depth) of linecard 105, linecard 105 may provide for a greater number of sockets 145. For example, in an exemplary implementation, a depth of linecard 105 may be longer than a width of linecard 105, which may allow a greater number of cables 325 to be connected to linecard 105 compared to a conventional linecard since a length of sockets 145 may correspond to the depth of linecard 105. For example, sockets 145 may extend a substantial length associated with the depth of linecard 105. In another exemplary implementation, the depth of linecard 105 may be shorter than a width of linecard 105. However, for example, when both sides 140 include sockets 145, such a configuration may allow a greater number of cables 325 to be connected to linecard 105 compared to a conventional linecard. In either instance, such a configuration is in contrast to a conventional card (e.g., a linecard) in which the front face of the linecard may be used as a region to connect cables to the linecard.

Figure 3C:
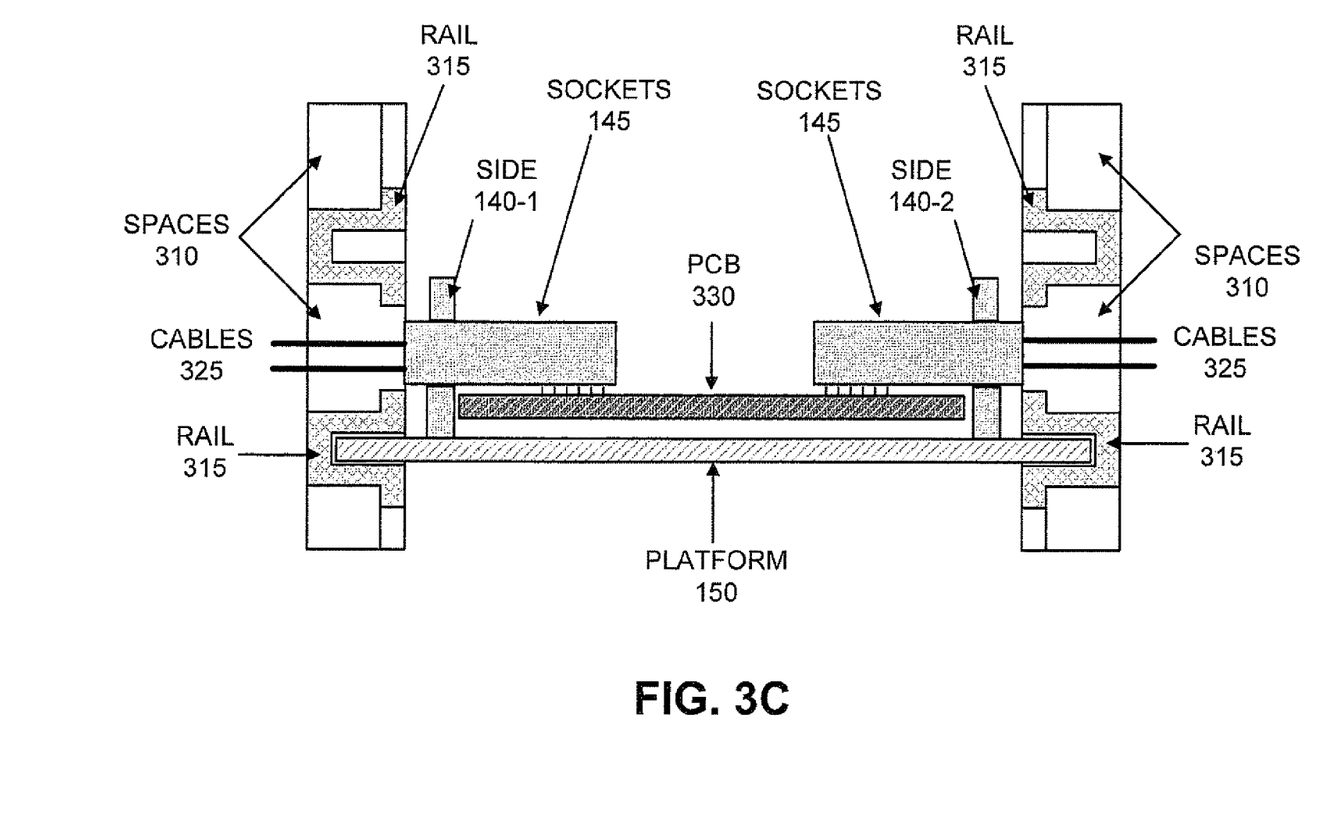
FIG. 3C is a diagram illustrating a frontal view of the exemplary multi-slot chassis and the exemplary linecard.

FIG. 3C is a diagram illustrating a frontal view of the exemplary multi-slot chassis 102 depicted in FIG. 3A and the exemplary linecard 105 depicted in FIG. 3B. As illustrated, linecard 105 may include a printed circuit board (PCB) 330.

Referring to FIG. 3C, rails 315 may be configured to receive platform 150 of linecard 105. For example, rails 315 may have a squared C configuration in which platform 150 may be supported. Spaces 310 may provide access to sockets 145 and cables 325. In this way, a user may access sockets 145 and cables 325 from sides 140 of linecard 105. Additionally, the number of cables 325 that may connect to linecard 105 via sockets 145 may be greater than a conventional linecard.

Exemplary Cable Management System

Figure 4A:
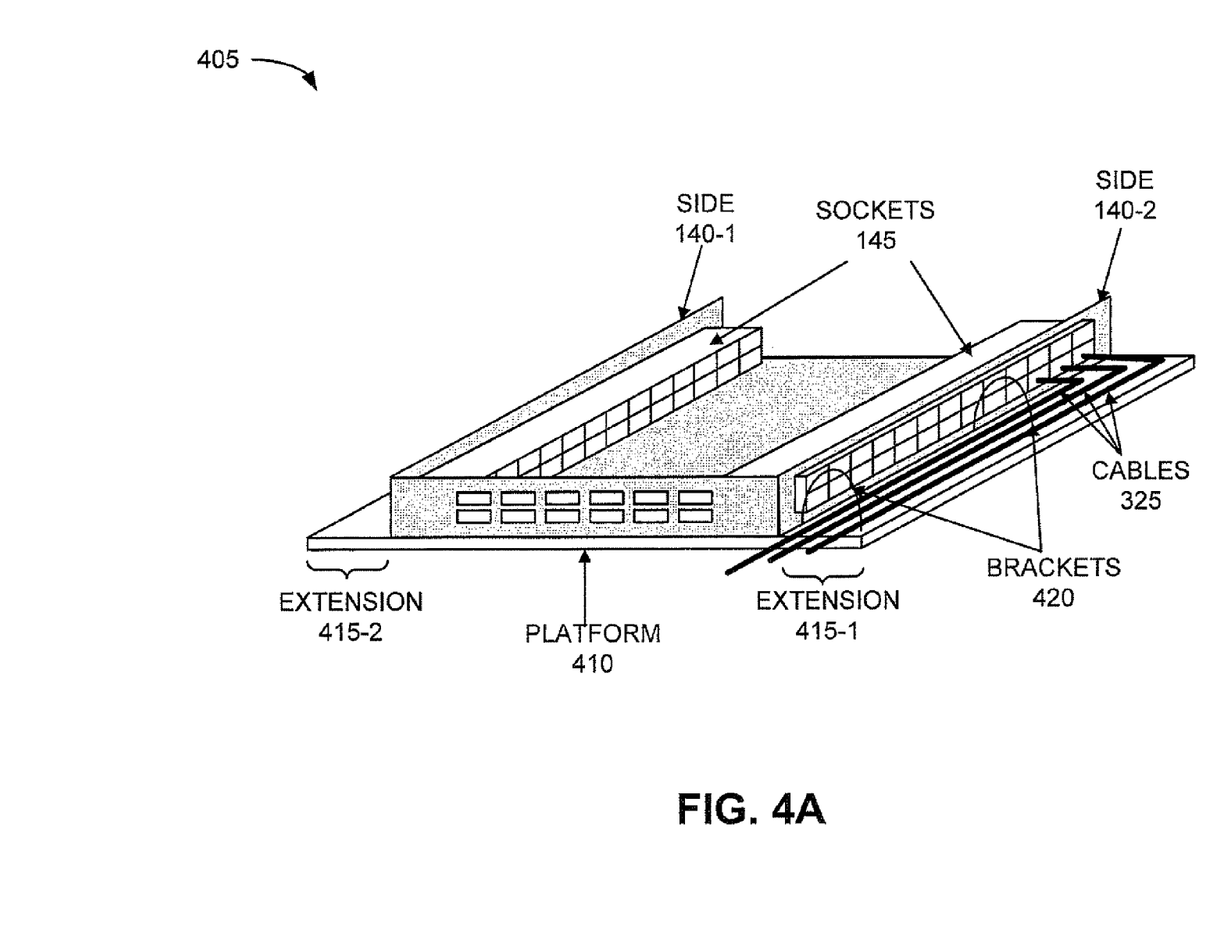
FIG. 4A is a diagram illustrating another exemplary linecard.

FIG. 4A is a diagram illustrating another exemplary linecard 405. As illustrated, linecard 405 may have a configuration similar to linecard 105 previously depicted in the figures and described in this description. However, platform 410 of linecard 405 may symmetrically extend, illustrated as extensions 415-1 and 415-2 (collectively referred to as extensions 415 and singularly referred to as extension 415), from sides 140 to accommodate a cable management system. In an exemplary implementation, cables 325 connected to linecard 405 via sockets 145 may be placed on or attached to extensions 415 of platform 410. For example, one or more brackets 420 may be anchored to extension 415 to bundle cables 325. Alternatively, brackets 420 may bundle cables 325 without being anchored to extension 415.

Figure 4B:
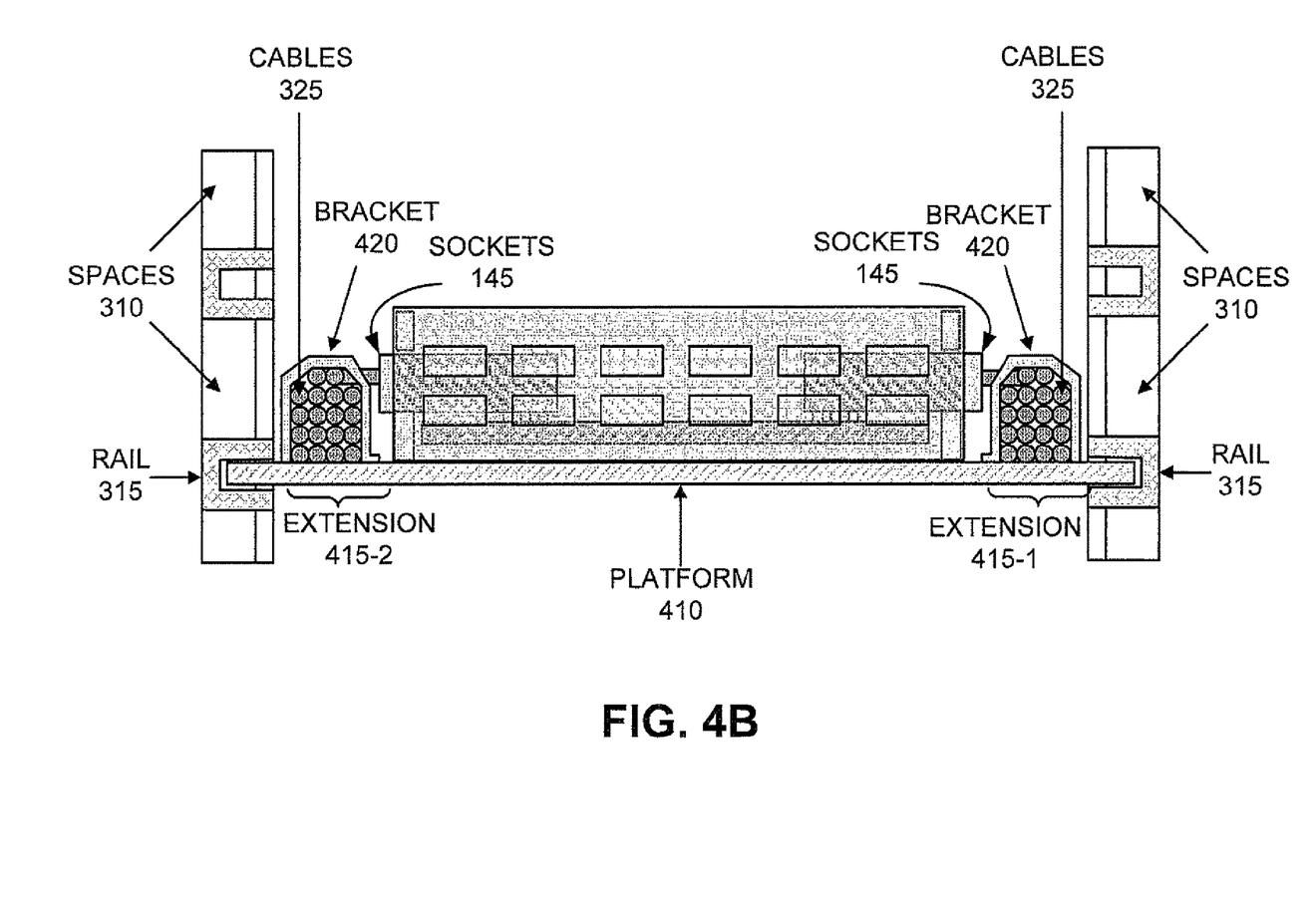
FIG. 4B is a diagram illustrating a frontal view of the exemplary multi-slot chassis and the exemplary linecard.

FIG. 4B is a diagram illustrating a frontal view of the exemplary multi-slot chassis 102 and the exemplary linecard 405. As illustrated, rails 315 may be configured to receive platform 410 of linecard 405. Spaces 310 may provide access to sockets 145 and cables 325. Based on the exemplary arrangement illustrated in FIG. 4B, a user may remove linecard 405 from multi-slot chassis 102 without having to disconnect cables 325 from sockets 145 of linecard 405.

In view of standard dimensions associated with chassis and cards, one or more components of this system may be modified in terms of dimensions. For example, in an exemplary implementation, a width associated with multi-slot chassis 102 may be increased in length (relative to a standard width) to accommodate a length associated with platform 410 (i.e., extensions 415). Additionally, or alternatively, a width associated with linecard 405 (e.g., front face 107) may be decreased (relative to a standard width) to provide extensions 415 associated with platform 410.

CONCLUSION

The foregoing description of implementations provides an illustration, but is not intended to be exhaustive or to limit the implementations to the precise form disclosed. Modifications and variations are possible in light of the above teachings or may be acquired from practice of the teachings. For example, while this description has described systems (e.g., the cable access system and the cable management system) having a midplane design, in other implementations, other types of designs (e.g., a backplane design, etc.) may be employed. For example, a backplane may include holes 125 to allow air to propagate via the backplane. In such a configuration, a cooling system may push or pull air via holes 125 to cool cards and/or other components, which may include holes 120, in the system having a backplane design. In this regard, one or more implementations described herein should not be deemed as dependent on a system having a midplane design. Additionally, or alternatively, while this description has described a system having a multi-slot chassis, in other implementations, a single slot chassis may be employed.

In addition, while a series of blocks have been described with regard to the process illustrated in FIG. 2, the order of the blocks may be modified in other implementations. Further, non-dependent blocks may be performed in parallel.

Spatially relative terms, such as "horizontal," "vertical," "front," and "rear" and the like, may be used herein for ease of description to describe an element or the element's relationship to another element as illustrated in the figures. Thus, these terms do not necessarily have only one operational meaning and are not intended to be limiting. It will be understood that the spatially relative terms may be intended to encompass different orientations of the device in use or operation in addition to the orientation depicted in the figures. The term "connect" and variations thereof (e.g., connected or connection) may be direct or indirect.

The term "may" is used throughout this application and is intended to be interpreted, for example, as "having the potential to," "configured to," or "being able," and not in a mandatory sense (e.g., as "must"). The terms "a," "an," and "the" are intended to be interpreted to include one or more items. Where only one item is intended, the term "one" or similar language (e.g., "single") is used. Further, the phrase "based on" is intended to be interpreted as "based, at least in part, on," unless explicitly stated otherwise. The term "and/or" is intended to be interpreted to include any and all combinations of one or more of the associated list items.

Even though particular combination of features are recited in the claims and/or disclosed in the specification, these combinations are not intended to limit the disclosure of the invention. In fact, many of these features may be combined in ways not specifically recited in the claims and/or disclosed in the specification.

No element, block, or instruction used in the present application should be construed as critical or essential to the implementations described herein unless explicitly described as such.

What is claimed is:

1. A device comprising:
    a midplane that includes holes;
    a first set of cards connected to a first side of the midplane;
    a second set of cards connected to a second side of the midplane,
        the first side being opposite the second side,
        sides of cards, of the second set of cards, including sockets that permit connections, from a plurality of devices, to the cards of the second set of cards,
        the cards, of the second set of cards, including holes; and
    one or more components to:
        produce an airflow having a particular direction,
            the airflow:
                cooling the first set of cards of the device,
                propagating through the holes of the midplane of the device towards the second set of cards of the device,
                cooling the second set of cards of the device, after propagating through the holes of the midplane, and
                exiting the device via the holes of the second set of cards.

2. The device of claim 1, where the one or more components are further to:
    produce another airflow having another direction that is opposite the particular direction,
        where the other airflow:
            cools the second set of cards,
            propagates through the holes of the midplane of the device towards the first set of cards, and
            cools the first set of cards of the device, after propagating through the holes of the midplane.

3. The device of claim 1, where the first set of cards are oriented in a first orientation, and
    where the second set of cards are oriented in a second orientation that is different than the first orientation.

4. The device of claim 3, where the first orientation is orthogonal to the second orientation.

5. The device of claim 1, where the airflow is produced by a cooling system of the device,
    where the midplane is oriented on a plane that is orthogonal to the first direction, and
    where the plane is orthogonal to the first set of cards and the second set of cards.

6. A device comprising:
    a midplane that includes holes;
    a first set of cards connected to a first side of the midplane;
    a second set of cards connected to a second side of the midplane,
        the first side being opposite the second side,
        an orientation of the first set of cards being different than an orientation of the second set of cards,
        sides of cards, of the second set of cards, including sockets that permit connections, from a plurality of devices, to the cards of the second set of cards,
        the cards, of the second set of cards, including holes; and
    a cooling system to:
        produce an airflow having a particular direction,
            the airflow:
                cooling the first set of cards of the device,
                propagating through the holes of the midplane of the device towards the second set of cards of the device,
                cooling the second set of cards of the device, after propagating through the holes of the midplane, and
                exiting the device via the holes of the cards of the second set of cards.

7. The device of claim 6, where the first set of cards and the second set of cards are oriented on different planes,
    where a front face, of a card of the second set of cards, includes only a plurality of holes, and
    where the airflow exits the device via the plurality of holes of the front face of the card.

8. The device of claim 6, where the midplane is oriented on a plane that is orthogonal to the particular direction, and
    where the plane is orthogonal to the orientation of the first set of cards and the orientation of the second set of cards.

9. The device of claim 6, where the airflow propagates through the device on a plane that is parallel to the orientation of the second set of cards.

10. The device of claim 6, where the cooling system resides on a single side of the device.

11. The device of claim 6, further comprising a multi-slot chassis that includes the midplane,
where the orientation of the first set of cards is orthogonal to the orientation of the second set of cards.

12. The device of claim 6, where the plurality of devices include one or more of a Universal Serial Bus (USB) plug, a nine-pin D-shell (DE-9) plug, an optical plug, or a telephone plug.

13. A device comprising:
a midplane that includes holes;
a first set of cards connected to a first side of the midplane;
a second set of cards connected to a second side of the midplane,
the first side being opposite the second side,
sides of at least one card, of the second set of cards, including sockets that permit connections, from a plurality of devices, to the at least one card,
a front face, of the at least one card, including a plurality of holes; and
a plurality of components to:
produce an airflow having a particular direction,
the airflow:
cooling the first set of cards of the device,
propagating through the holes of the midplane of the device towards the second set of cards of the device,
cooling the second set of cards of the device, after propagating through the holes of the midplane, and
exiting the device via the plurality of holes of the at least one card.

14. The device of claim 13, where the first set of cards are oriented in a first orientation, and
where the second set of cards are oriented in a second orientation that is different than the first orientation.

15. The device of claim 14, where the first orientation is orthogonal to the second orientation.

16. The device of claim 13, where the plurality of components corresponds to components of a cooling system of the device,
where the midplane is oriented on a plane that is orthogonal to the first direction, and
where the plane is orthogonal to an orientation of the first set of cards and an orientation of the second set of cards.

17. The device of claim 13, where the airflow propagates through the device on a plane that is parallel to an orientation of the second set of cards.

18. The device of claim 13, where the device comprises a multi-slot chassis that includes the midplane,
where an orientation of the first set of cards is orthogonal to an orientation of the second set of cards, and
where the front face includes only the plurality of holes.

19. The device of claim 13, where the plurality of components corresponds to components of a cooling system of the device,
where the plurality of components are further to:
produce another airflow having another direction that is opposite the particular direction,
where the other airflow is to:
to cool the second set of cards,
propagate through the holes of the midplane of the device towards the first set of cards, and
cool the first set of cards of the device, after propagating through the holes of the midplane.

20. The device of claim 19, where the other airflow exits the device after cooling the first set of cards.

* * * * *